(12) United States Patent
Takahashi (10) Patent No.: US 10,468,387 B2
(45) Date of Patent: Nov. 5, 2019

(54) SEMICONDUCTOR DEVICE HAVING PLATE-SHAPED METAL TERMINALS FACING ONE ANOTHER

(71) Applicants: Kabushiki Kaisha Toshiba, Minato-ku, Tokyo (JP); Toshiba Electronic Devices & Storage Corporation, Minato-ku, Tokyo (JP)

(72) Inventor: Wataru Takahashi, Himeji Hyogo (JP)

(73) Assignees: Kabushiki Kaisha Toshiba, Tokyo (JP); Toshiba Electronic Device & Storage Corporation, Tokyo (JP)

( * ) Notice: Subject to any disclaimer, the term of this patent is extended or adjusted under 35 U.S.C. 154(b) by 0 days.

(21) Appl. No.: 15/998,398

(22) Filed: Aug. 15, 2018

(65) Prior Publication Data

US 2019/0295991 A1  Sep. 26, 2019

(30) Foreign Application Priority Data

Mar. 21, 2018 (JP) .................. 2018-053683

(51) Int. Cl.
| | |
|---|---|
| *H01L 25/07* | (2006.01) |
| *H01L 29/417* | (2006.01) |
| *H01L 23/00* | (2006.01) |
| *H01L 21/56* | (2006.01) |
| *H01L 29/49* | (2006.01) |

(52) U.S. Cl.
CPC .......... *H01L 25/072* (2013.01); *H01L 21/565* (2013.01); *H01L 24/44* (2013.01); *H01L 29/41725* (2013.01); *H01L 29/49* (2013.01); *H01L 2924/13091* (2013.01)

(58) Field of Classification Search
CPC . H01L 25/072; H01L 29/41725; H01L 24/44; H01L 21/565; H01L 29/49; H01L 2924/13091
See application file for complete search history.

(56) References Cited

U.S. PATENT DOCUMENTS

| 8,247,888 B2 | 8/2012 | Masuda et al. |
| 8,853,004 B2 | 10/2014 | Sakakibara et al. |
| 2016/0079143 A1 | 3/2016 | Sakamoto |

FOREIGN PATENT DOCUMENTS

| JP | 2013-141047 A | 7/2013 |
| JP | 2013-187441 A | 9/2013 |
| JP | 2014-39067 A | 2/2014 |
| WO | 2015-037072 A1 | 3/2015 |

*Primary Examiner* — Sonya D. McCall-Shepard
(74) *Attorney, Agent, or Firm* — White & Case LLP (57) ABSTRACT

Provided is a semiconductor device according to an embodiment including a plate-shaped first metal terminal, a plate-shaped second metal terminal provided to face the first metal terminal, a resin layer provided between the first metal terminal and the second metal terminal, and a semiconductor chip having a first upper electrode electrically connected to the first metal terminal and a first lower electrode electrically connected to the second metal terminal, wherein a first distance between the first metal terminal and the second metal terminal at the end portion of the first metal terminal is larger than a second distance between the first metal terminal and the second metal terminal at a portion inside the end portion of the first metal terminal.

12 Claims, 7 Drawing Sheets

SEMICONDUCTOR DEVICE HAVING PLATE-SHAPED METAL TERMINALS FACING ONE ANOTHER

CROSS-REFERENCE TO RELATED APPLICATION

This application is based upon and claims the benefit of priority from Japanese Patent Application No. 2018-053683, filed on Mar. 21, 2018, the entire contents of which are incorporated herein by reference.

FIELD

Embodiments described herein relate generally to a semiconductor device.

BACKGROUND

In a power semiconductor module, a plurality of power semiconductor chips are mounted on, for example, a metal substrate with an insulating layer interposed therebetween. The power semiconductor chip is, for example, an insulated gate bipolar transistor (IGBT), a metal oxide field effect transistor (MOSFET), or a diode.

In a power semiconductor module, if wiring inductance (hereinafter, referred to as inductance) is large, an over voltage called a surge voltage occurs when switching-off operation is performed at a high speed. In consideration of the surge voltage, if a breakdown voltage of the semiconductor chip is designed to be high, there is a problem that on-resistance of the semiconductor chip increases, and conduction loss becomes large. In addition, by lengthening the time of the off operation, the surge voltage can be reduced. However, there is a problem that switching loss becomes large. Therefore, it is desired to reduce the inductance of the power semiconductor module.

DETAILED DESCRIPTION

In this specification, the same or similar members are denoted by the same reference numerals, and in some cases, redundant description thereof may be omitted.

In this specification, in order to indicate a positional relationship of components or the like, the upward direction of the drawing may be described as "upper," and the downward direction of the drawing may be described as "lower". In this specification, the concepts of "upper" and "lower" are not necessarily terms indicating the relationship with the direction of gravity.

First Embodiment

A semiconductor device according to a first embodiment includes a plate-shaped first metal terminal, a plate-shaped second metal terminal provided to face the first metal terminal, a resin layer provided between the first metal terminal and the second metal terminal, and a semiconductor chip having a first upper electrode electrically connected to the first metal terminal and a first lower electrode electrically connected to the second metal terminal, wherein a first distance between the first metal terminal and the second metal terminal at an end portion of the first metal terminal on a side opposite to a side electrically connected to the semiconductor chip is larger than a second distance between the first metal terminal and the second metal terminal at a portion located in a direction from the end portion of the first metal terminal toward the semiconductor chip.

In addition, a semiconductor device according to the first embodiment includes a substrate; a first metal layer provided on the substrate; a second metal layer provided on the substrate; a first semiconductor chip provided on the first metal layer and having a first upper electrode, a first lower electrode, and a first gate electrode; a second semiconductor chip provided on the second metal layer and having a second upper electrode, a second lower electrode, and a second gate electrode; a plate-shaped first metal terminal electrically connected to the first upper electrode; a plate-shaped second metal terminal provided to face the first metal terminal and electrically connected to the second lower electrode; a third metal terminal electrically connected to the first lower electrode and the second upper electrode; a first gate terminal electrically connected to the first gate electrode; a second gate terminal electrically connected to the second gate electrode; and a resin layer provided between the first metal terminal and the second metal terminal, wherein a first distance between the first metal terminal and the second metal terminal at an end portion of the first metal terminal on a side opposite to a side electrically connected to the first semiconductor chip is larger than a second distance between the first metal terminal and the second metal terminal at a portion located in a direction from the end portion of the first metal terminal toward the first semiconductor chip.

Figure 1A:
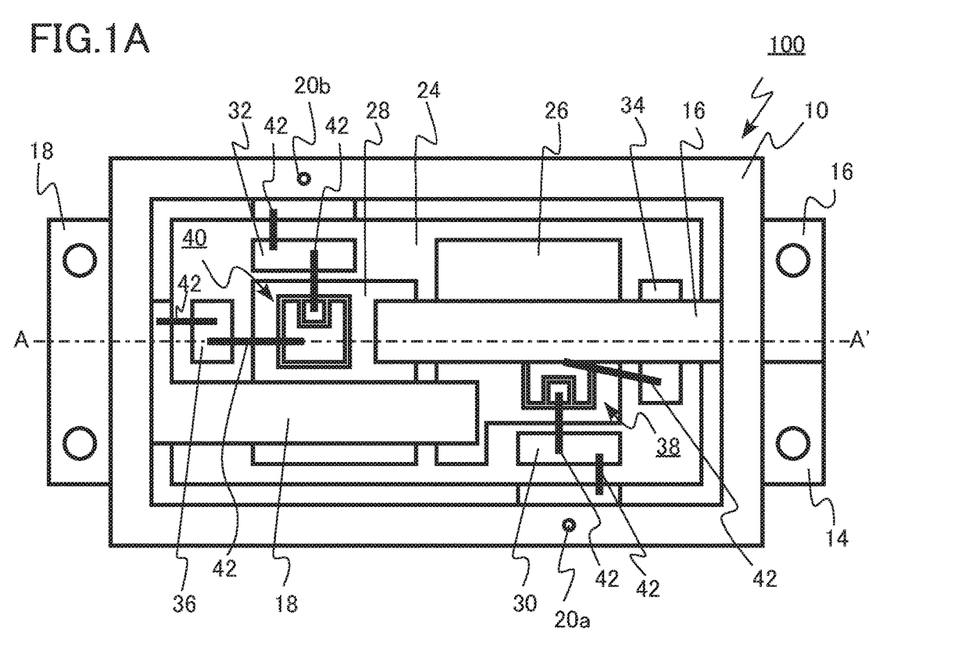
FIGS. 1A and 1B are schematic top diagrams of a semiconductor device according to a first embodiment.
Figure 1B:
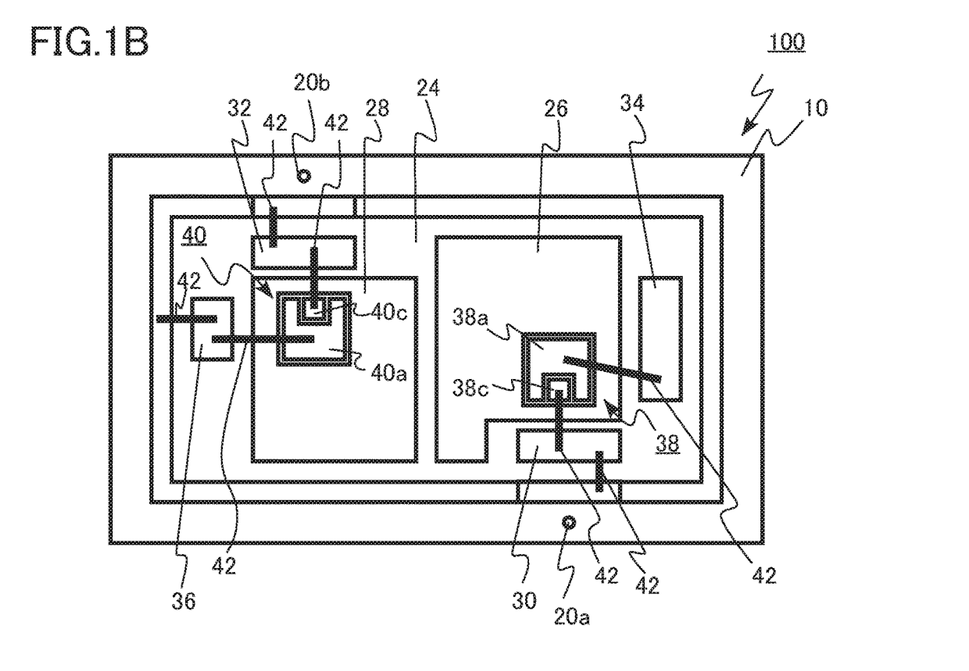
Figure 2:
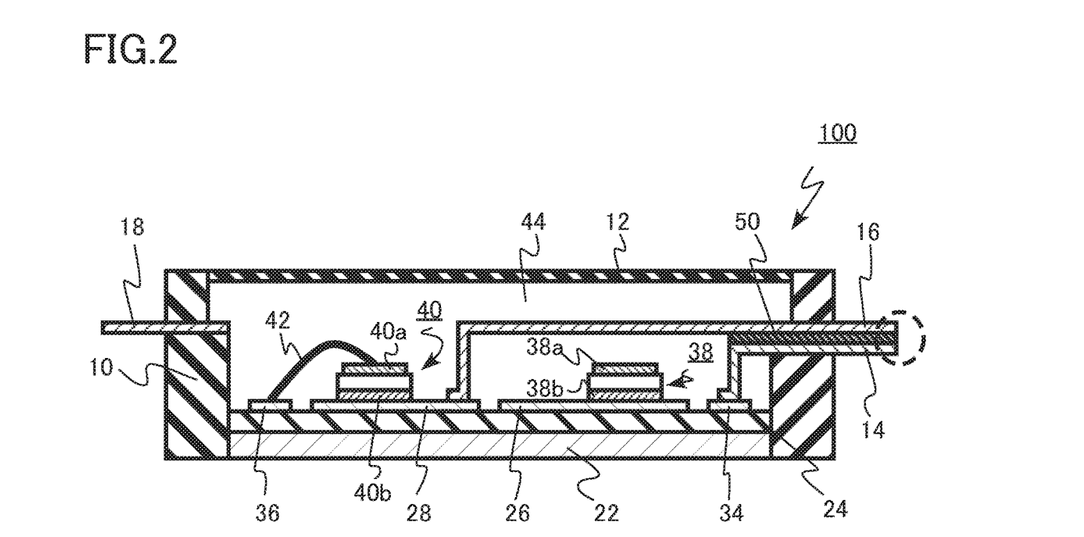
FIG. 2 is a schematic cross-sectional diagram of the semiconductor device according to the first embodiment.
Figure 3:
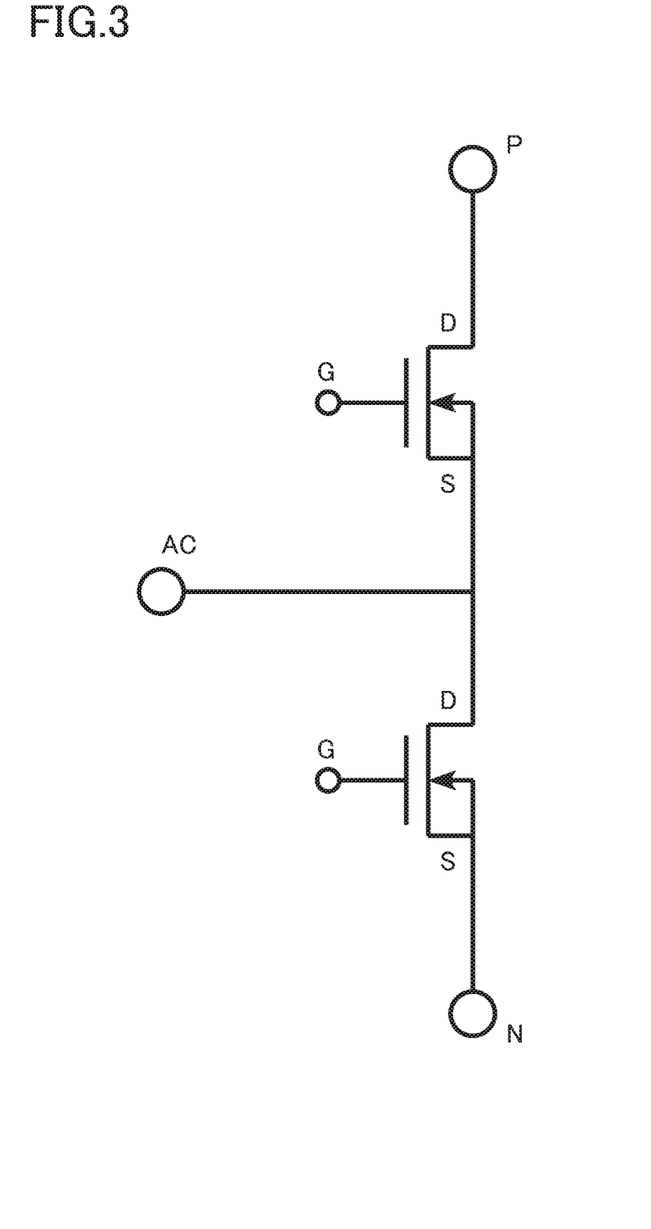
FIG. 3 is an equivalent circuit diagram of the semiconductor device according to the first embodiment.

FIGS. 1A and 1B are schematic top diagrams of the semiconductor device according to the first embodiment. FIG. 2 is a schematic cross-sectional diagram of the semiconductor device according to the first embodiment. FIG. 3 is an equivalent circuit diagram of the semiconductor device according to the first embodiment.

The semiconductor device according to the first embodiment is a power semiconductor module 100. As illustrated in FIG. 3, in the power semiconductor module 100 of the first embodiment, two MOSFETs are connected in series. The power semiconductor module of the first embodiment is a so-called "2-in-1" type module capable of configuring a half bridge circuit with one module. For example, a three-phase inverter circuit can be configured by using three power semiconductor modules of the first embodiment.

The power semiconductor module 100 of the first embodiment includes a resin case 10, a lid 12, an N power terminal 14 (first metal terminal), a P power terminal 16 (second metal terminal), an AC output terminal 18 (third metal terminal), a gate terminal 20a (first gate terminal), a gate terminal 20b (second gate terminal), a metal substrate 22

(substrate), a resin insulating layer 24, a first metal layer 26, a second metal layer 28, a first gate metal layer 30, a second gate metal layer 32, a first source metal layer 34, a second source metal layer 36, a MOSFET 38 (semiconductor chip, a first semiconductor chip), a MOSFET 40 (second semiconductor chip), a bonding wire 42, a silicone gel 44, and an inter-terminal resin layer 50 (resin layer).

FIG. 1A is a top diagram of the power semiconductor module 100 in the state where the lid 12 and the silicone gel 44 are removed. In addition, FIG. 1B is a top diagram of the state where the lid 12, the N power terminal 14 (first metal terminal), the P power terminal 16 (second metal terminal), the AC output terminal 18 (third metal terminal), and the silicone gel 44 are removed from the power semiconductor module 100.

FIG. 2 is a cross-sectional diagram taken along line A-A' illustrated in FIG. 1A.

The metal substrate 22 (substrate) is, for example, copper. For example, when mounting in semiconductor module on a product, a heat dissipation plate (not illustrated) is connected to the back surface of the metal substrate 22.

The resin case 10 is provided around the metal substrate 22. A lid 12 is provided on the resin case 10. In addition, the inside of the semiconductor module is filled with a silicone gel 44 as a sealing material. The resin case 10, the metal substrate 22, the lid 12, and the silicone gel 44 have a function of protecting or insulating the members inside the semiconductor module.

An N power terminal 14, a P power terminal 16, an AC output terminal 18, a gate terminal 20a, and a gate terminal 20b are provided in an upper portion of the resin case 10. For example, a positive voltage is applied from the outside to the P power terminal 16. For example, a negative voltage is applied from the outside to the N power terminal 14.

The N power terminal 14, the P power terminal 16, the AC output terminal 18, the gate terminal 20a, and the gate terminal 20b are a metal. The N power terminal 14, the P power terminal 16, the AC output terminal 18, the gate terminal 20a, and the gate terminal 20b are, for example, copper or a copper alloy.

The N power terminal 14 and P power terminal 16 are plate-shaped. At least a portion of the P power terminal 16 faces at least a portion of the N power terminal 14. The N power terminal 14 and the P power terminal 16 have regions facing each other in parallel. In other words, at least a portion of the N power terminal 14 and at least a portion of the P power terminal 16 are parallel flat plates.

The inter-terminal resin layer 50 is provided between the N power terminal 14 and the P power terminal 16. The inter-terminal resin layer 50 has a function of insulating the N power terminal 14 from the P power terminal 16. The inter-terminal resin layer 50 is, for example, a thermoplastic resin. The inter-terminal resin layer 50 is, for example, an epoxy resin.

The resin insulating layer 24 is provided on the metal substrate 22. The resin insulating layer 24 has a function of insulating the metal substrate 22 from the first metal layer 26 and the second metal layer 28. The resin insulating layer 24 contains fillers having a high thermal conductivity and being formed of, for example, a boron nitride or the like in the resin.

The first metal layer 26 and the second metal layer 28 are provided on the resin insulating layer 24. The first metal layer 26 and the second metal layer 28 are provided on substantially the same plane. The first metal layer 26 and the second metal layer 28 are, for example, copper.

The P power terminal 16 is connected to the second metal layer 28. The P power terminal 16 is connected to the second metal layer 28 by using, for example, solder or Ag nanoparticles.

The gate metal layer 30 and the gate metal layer 32 are provided on the resin insulating layer 24.

The first source metal layer 34 and the second source metal layer 36 are provided on the resin insulating layer 24. The N power terminal 14 is connected to the first source metal layer 34. The first source metal layer 34 has a function of connecting the semiconductor chip and the N power terminal 14. N power terminal 14 is connected to the first source metal layer 34 by using, for example, solder or Ag nanoparticles.

The second source metal layer 36 has a function of connecting the semiconductor chip and the AC output terminal 18.

The MOSFET 38 is provided on the first metal layer 26. The MOSFET 38 is connected to the first metal layer 26 by using, for example, solder or Ag nanoparticles.

The MOSFET 38 has a source electrode 38a (first upper electrode) and a gate electrode 38c (first gate electrode) on the upper surface thereof and a drain electrode 38b (first lower electrode) on the lower surface thereof. The source electrode 38a is electrically connected to the N power terminal 14. The drain electrode 38b is electrically connected to the first metal layer 26. The gate electrode 38c is connected to the gate terminal 20a by using the gate metal layer 30 and the bonding wire 42. The bonding wire 42 is, for example, an aluminum wire.

The MOSFET 40 is provided on the second metal layer 28. The MOSFET 38 is connected to the first metal layer 26 by using, for example, solder or Ag nanoparticles.

The MOSFET 40 has a source electrode 40a (second upper electrode) and a gate electrode 40c (second gate electrode) on the upper surface thereof and a drain electrode 40b (second lower electrode) on the lower surface thereof. The source electrode 40a is electrically connected to the AC output terminal 18. The drain electrode 40b is electrically connected to the second metal layer 28. The gate electrode 40c is connected to the gate terminal 20b by using the gate metal layer 32 and the bonding wire 42.

The drain electrode 38b (first lower electrode) of the MOSFET 38 is connected to the P power terminal 16 through the MOSFET 40. The drain electrode 38b is electrically connected to the AC output terminal 18.

The MOSFET 38 and the MOSFET 40 are, for example, semiconductor chips using a silicon carbide (SiC) or silicon (Si).

Figure 4:
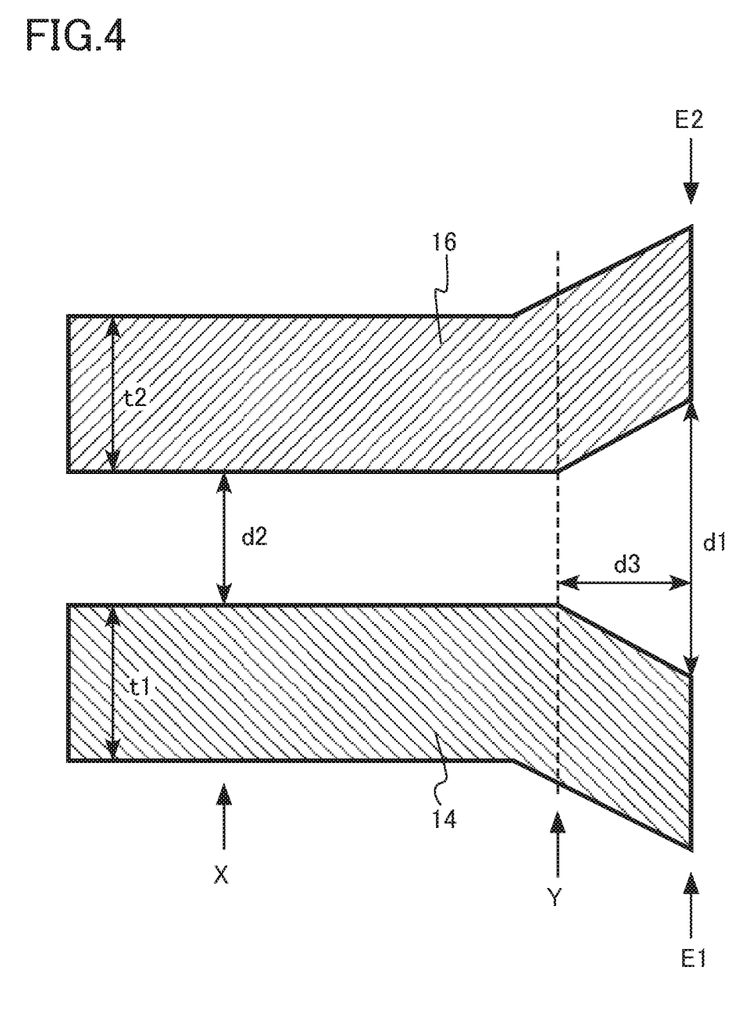
FIG. 4 is an enlarged schematic diagram of a portion of the semiconductor device according to the first embodiment.

FIG. 4 is an enlarged schematic diagram of a portion of the semiconductor device according to the first embodiment. FIG. 4 is an enlarged diagram of a region surrounded by a broken line in FIG. 2. In FIG. 4, the inter-terminal resin layer 50 is omitted in illustration.

A first distance (d1 in FIG. 4) between the N power terminal 14 and the P power terminal 16 at an end portion (E1 in FIG. 4) of the N power terminal 14 is larger than a second distance (d2 in FIG. 4) between the N power terminal 14 and the P power terminal 16 at a portion (X in FIG. 4) inside the end portion E1 of the N power terminal 14. The end portion E1 of the N power terminal 14 is the end portion opposite to the side electrically connected to the MOSFET 40. In addition, a portion inside the end portion E1 of the N power terminal 14 is located in a direction from the end portion E1 of the N power terminal 14 toward the MOSFET 40. In addition, an end portion (E2 in FIG. 4) of the P power terminal 16 is located to face the end portion E1 of the N power terminal 14 through the inter-terminal resin layer 50. The end portion E2 of the P power terminal 16 and the end portion E1 of the N power terminal 14 face each other.

For example, in the range from X in FIG. 4 to the end portion E1 of the N power terminal 14 and the end portion E2 of the P power terminal 16, the thickness of the N power terminal 14 and the thickness of the P power terminal 16 are equal to each other within a tolerance range.

The second distance d2 is, for example, 0.01 mm or more and 0.5 mm or less.

The first distance d1 is, for example, 1.2 times or more and 2.0 times or less the second distance d2. The first distance d1 is, for example, 0.012 mm or more and 1.0 mm or less.

The thickness (t1 in FIG. 4) of the N power terminal 14 is, for example, 0.1 mm or more and 1.0 mm or less. The thickness (t2 in FIG. 4) of the P power terminal 16 is, for example, 0.1 mm or more and 1.0 mm or less.

A third distance d3 from the end portion E1 of the N power terminal 14 to the position (Yin FIG. 4) where the distance between the N power terminal 14 and the P power terminal 16 is substantially constant is, for example, half the thickness of the N power terminal 14. In other words, the distance d3 from the position Y where the distance between the N power terminal 14 and the P power terminal 16 starts to be expanded to the end portion E1 of the N power terminal 14 is, for example, half the thickness of the N power terminal 14. The third distance d3 is, for example, 0.05 mm or more and 0.5 mm or less.

Next, the function and effect of the semiconductor device according to the first embodiment will be described.

In a power semiconductor module, if the inductance is large, an over voltage called a surge voltage is generated when a switching-off operation is performed at a high speed. In consideration of the surge voltage, when the breakdown voltage of the semiconductor chip is designed to be high, the on-resistance of the semiconductor chip increases, and thus, there occurs a problem that the conduction loss becomes large. In addition, although the surge voltage can be reduced by lengthening the time of the off operation, there occurs a problem that the switching loss becomes large. Therefore, it is preferable that the inductance of the power semiconductor module is reduced.

Figure 5:
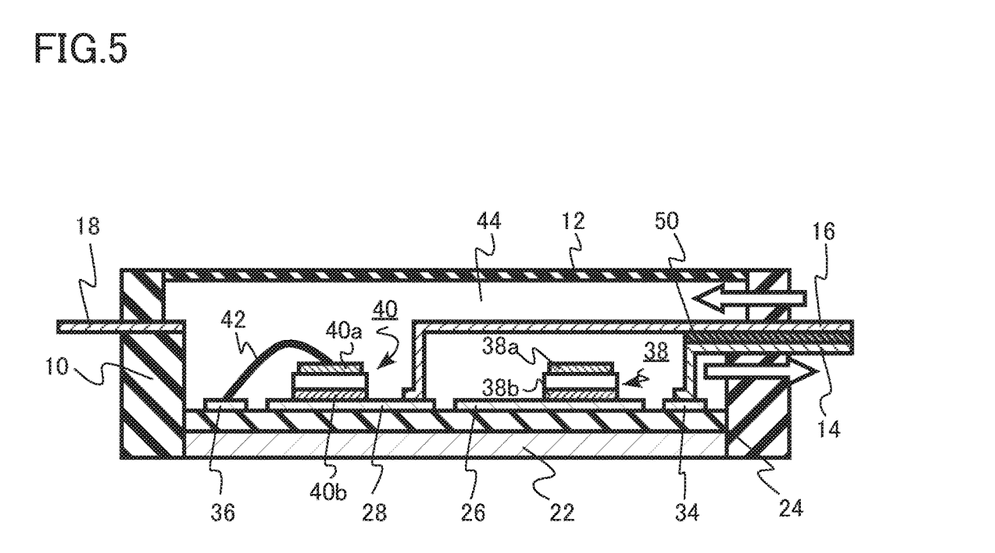
FIG. 5 is an explanatory diagram of a function and effect of the first embodiment.

FIG. 5 is an explanatory diagram of the function and effect of the first embodiment. FIG. 5 corresponds to the cross-sectional diagram illustrated in FIG. 2.

In the power semiconductor module 100 of the first embodiment, portions of the N power terminal 14 and the P power terminal 16 become parallel flat plates. The inter-terminal resin layer 50 is provided for insulation between the N power terminal 14 and the P power terminal 16 in a region (hereinafter, referred to as a parallel flat plate region) where the N power terminal 14 and the P power terminal 16 become parallel flat plates.

The current flows in from the outside of the power semiconductor module 100 through the P power terminal 16 and flows out of the N power terminal 14 through the MOSFET 40 and the MOSFET 38. The directions of the currents flowing through the N power terminal 14 and the P power terminal 16 are indicated by white arrows in FIG. 5. As illustrated in FIG. 5, in the parallel flat plate region, the directions of the currents flowing through the N power terminal 14 and the P power terminal 16 are opposite to each other.

The inductance of the wiring includes self inductance according to self induction and mutual inductance according to mutual induction. The inductance of the wiring is a sum of the self inductance and the mutual inductance. For example, as the inductance of the N power terminal 14 and the P power terminal 16, there are the self inductance of the N power terminal 14 and the P power terminal 16 and the mutual inductance associated with the mutual induction of the N power terminal 14 and the P power terminal 16.

In the power semiconductor module 100 of the first embodiment, the currents flow in the opposite directions in the parallel flat plate region of the N power terminal 14 and the P power terminal 16. For this reason, the mutual inductance acts in the direction to cancel the self inductance. Therefore, the inductance of the N power terminal 14 and the P power terminal 16 is reduced.

The inductances of the N power terminal 14 and the P power terminal 16 is a portion of the inductance of the power semiconductor module 100. Therefore, the inductance of the power semiconductor module 100 is reduced.

The inductance of the parallel flat plate region of the N power terminal 14 and the P power terminal 16 is increased as the distance between the N power terminal 14 and the P power terminal 16 is shorter. Therefore, from the viewpoint of reducing the inductance of the power semiconductor module 100, it is preferable that the distance between the N power terminal 14 and the P power terminal 16 is minimized.

For example, the N power terminal 14 and the P power terminal 16 having the parallel flat plate region are manufactured by molding two plate-shaped metal members in advance. During the molding, a mold resin is allowed to flow between the N power terminal 14 and the P power terminal 16 to form the inter-terminal resin layer 50.

As the distance between the N power terminal 14 and the P power terminal 16 is decreased in order to reduce the inductance of the parallel flat plate region, during the molding, the space between the N power terminal 14 and the P power terminal 16 is not sufficiently filled with the mold resin, and thus, there is a concern that insulation failure between the N power terminal 14 and the P power terminal 16 may occur. For example, non-filling (air pockets) of the mold resin is generated, so that insulation failure occurs.

Figure 6:
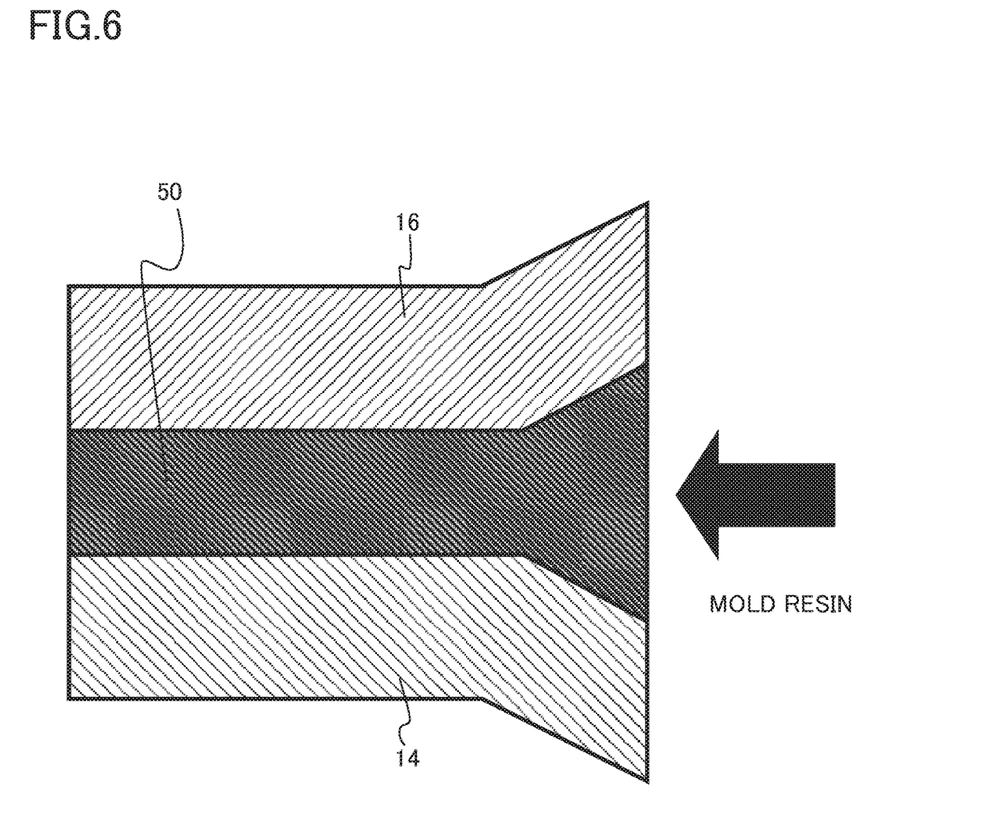
FIG. 6 is an explanatory diagram of the function and effect of the first embodiment.

FIG. 6 is an explanatory diagram of the function and effect of the first embodiment.

For example, during molding, a mold resin is allowed to flow as illustrated in FIG. 6 from the end portions of the N power terminal 14 and the P power terminal 16. The end portions of the N power terminal 14 and the P power terminal 16 serve as inlets of the mold resin. Since the end portions of the N power terminal 14 and the P power terminal 16 are expanded, the sliding resistance between the N power terminal 14 and the P power terminal 16 and the mold resin is decreased. The sliding resistance denotes resistance generated when an object flows.

As the sliding resistance is decreased, the mold resin flows easily between the N power terminal 14 and the P power terminal 16, so that the mold resin is sufficiently filled. The filling ability of the mold resin is improved. Therefore, insulation failure between the N power terminal 14 and the P power terminal 16 can be suppressed. Therefore, it is possible to reduce the distance between the N power terminal 14 and the P power terminal 16.

Even in a case where the end portions of the N power terminal 14 and the P power terminal 16 serve as outlets of the mold resin, similarly, the sliding resistance is reduced, so that the mold resin flows out easily. Therefore, also in this case, this configuration contributes to improving the filling ability of the mold resin between the N power terminal 14 and the P power terminal 16.

In order to manufacture a shape in which the end portions of the N power terminal 14 and the P power terminal 16 are expanded, for example, there are the following methods. When forming the N power terminal 14 or the P power terminal 16 from a metal plate, for example, the metal plate is cut by punching out with a metal mold. At this time, sagging of the metal plate occurs on the punched surface. That is, sagging occurs at the cut portion, that is, the end portion of the N power terminal 14 or the P power terminal 16.

During the molding, the sag of the N power terminal 14 and the sag of the P power terminal 16 are allowed to face each other so as to be directed in opposite directions, so that the end portions of the N power terminal 14 and the P power terminal 16 are expanded. Therefore, the shape in which the end portions of the N power terminal 14 and the P power terminal 16 are expanded is manufactured.

It is preferable that the second distance d2 is 0.01 mm or more and 0.5 mm or less. When the second distance is below the afore-mentioned range, insulation failure may occur. When the second distance exceeds the afore-mentioned range, the inductance reduction effect may be insufficient.

It is preferable that the first distance d1 is 1.2 times or more and 2.0 times or less the second distance d2. When the first distance is below the afore-mentioned range, there is a concern that the sliding resistance reduction effect may be insufficient. It is difficult for the first distance to exceed the afore-mentioned range in terms of processing.

It is preferable that the third distance d3 is 0.05 mm or more and 0.5 mm or less. When the third distance is below the afore-mentioned range, there is a concern that the sliding resistance reduction effect may be insufficient. Even in a case where the third distance exceeds the afore-mentioned range, there is a concern that the sliding resistance reduction effect may be insufficient.

As described above, according to the first embodiment, it is possible to realize the power semiconductor module 100 capable of reducing the inductance by decreasing the distance between the N power terminal 14 and the P power terminal 16.

Second Embodiment

A semiconductor device according to a second embodiment is different from that of the first embodiment in that the shape of the end portion of the first metal terminal is different. Hereinafter, redundant description of the same contents as those of the first embodiment will be partially omitted.

Figure 7:
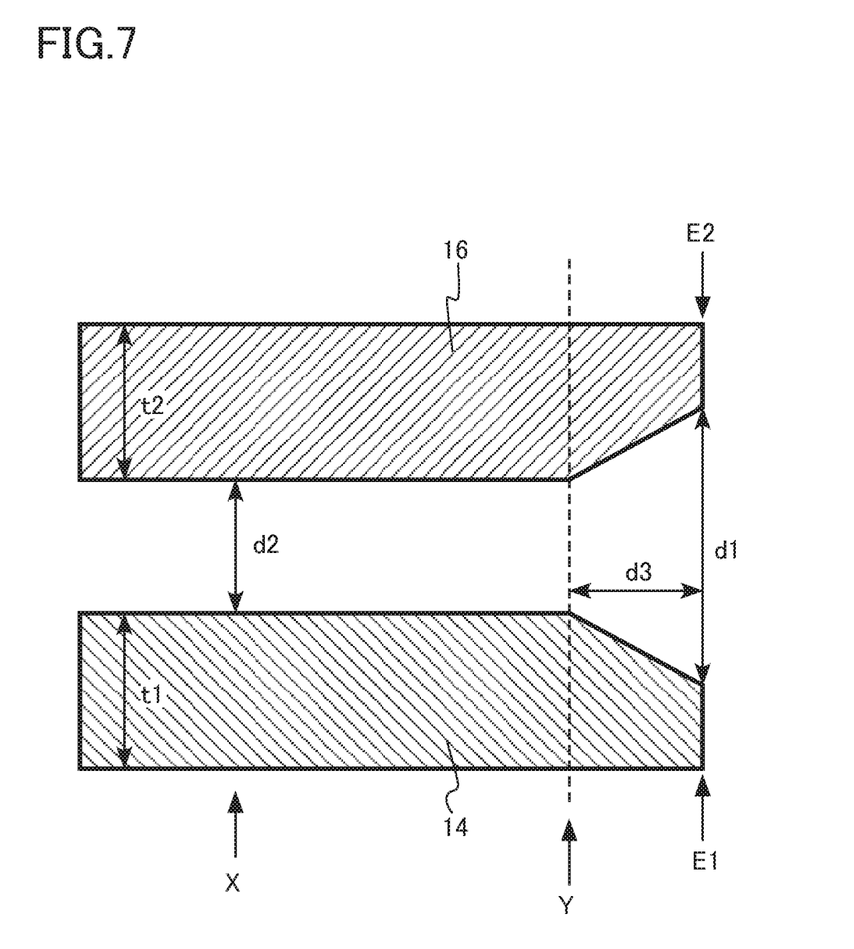
FIG. 7 is an enlarged schematic diagram of a portion of the semiconductor device according to the second embodiment.

FIG. 7 is an enlarged schematic diagram of a portion of the semiconductor device according to the second embodiment. FIG. 7 is a diagram corresponding to FIG. 4 of the first embodiment. In FIG. 7, the inter-terminal resin layer 50 is omitted in illustration.

The first distance (d1 in FIG. 7) between the N power terminal 14 and the P power terminal 16 at the end portion (E1 in FIG. 7) of the N power terminal 14 is larger than the second distance (d2 in FIG. 7) between the N power terminal 14 and the P power terminal 16 at a portion (X in FIG. 7) inside the end portion E1 of the N power terminal 14. In addition, the end portion (E2 in FIG. 7) of the P power terminal 16 is located to face the end portion E1 of the N power terminal 14 through the inter-terminal resin layer 50.

The outer surface (lower surface) of the N power terminal 14 and the outer surface (upper surface) of the P power terminal 16 are flat. The thickness of the N power terminal 14 is thinned toward the end portion E1. The thickness of the P power terminal 16 is thinned toward the end portion E2.

In addition, the shape in which the end portions of the N power terminal 14 and the P power terminal 16 are expanded as illustrated in FIG. 7 can be manufactured, for example, by selectively scraping the inside of the end portions of the N power terminal 14 and the P power terminal 16 before the formation using the mold.

As described above, according to the second embodiment, similarly to the first embodiment, it is possible to realize a power semiconductor module capable of reducing the inductance by decreasing the distance between the N power terminal 14 and the P power terminal 16.

In the first and second embodiments, a case where a MOSFET is used as a semiconductor chip has been described as an example, but the semiconductor chip is not limited thereto. For example, the semiconductor chip may be applied to other transistors and diodes such as an IGBT, a Shottky barrier diode (SBD), or a PIN diode. In addition, the semiconductor chip may also be applied to a combination of a transistor and a diode.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a plate-shaped first metal terminal;
   a plate-shaped second metal terminal facing the first metal terminal;
   a resin layer between the first metal terminal and the second metal terminal; and
   a semiconductor chip having a first upper electrode electrically connected to the first metal terminal and a first lower electrode electrically connected to the second metal terminal,
   wherein a first distance between the first metal terminal and the second metal terminal at an end portion of the first metal terminal on a side opposite to a side electrically connected to the semiconductor chip is larger than a second distance between the first metal terminal and the second metal terminal at a portion located in a direction from the end portion of the first metal terminal toward the semiconductor chip.

2. The semiconductor device according to claim 1, wherein an end portion of the second metal terminal exists at a position facing the end portion of the first metal terminal.

3. The semiconductor device according to claim 1, wherein the first distance is 1.2 times or more and 2.0 times or less the second distance.

4. The semiconductor device according to claim 1, wherein a thickness of the first metal terminal is equal to a thickness of the second metal terminal.

5. The semiconductor device according to claim 1, wherein a thickness of the first metal terminal is thinned toward the end portion of the first metal terminal and a thickness of the second metal terminal is thinned toward the end portion of the second metal terminal.

6. The semiconductor device according to claim 1, wherein the resin layer is a thermoplastic resin.

7. A semiconductor device comprising:
- a substrate;
- a first metal layer on the substrate;
- a second metal layer on the substrate;
- a first semiconductor chip on the first metal layer and having a first upper electrode, a first lower electrode, and a first gate electrode;
- a second semiconductor chip on the second metal layer and having a second upper electrode, a second lower electrode, and a second gate electrode;
- a plate-shaped first metal terminal electrically connected to the first upper electrode;
- a plate-shaped second metal terminal facing the first metal terminal and electrically connected to the second lower electrode;
- a third metal terminal electrically connected to the first lower electrode and the second upper electrode;
- a first gate terminal electrically connected to the first gate electrode;
- a second gate terminal electrically connected to the second gate electrode; and
- a resin layer between the first metal terminal and the second metal terminal,
- wherein a first distance between the first metal terminal and the second metal terminal at an end portion of the first metal terminal on a side opposite to a side electrically connected to the first semiconductor chip is larger than a second distance between the first metal terminal and the second metal terminal at a portion located in a direction from the end portion of the first metal terminal toward the first semiconductor chip.

8. The semiconductor device according to claim 7, wherein an end portion of the second metal terminal exists at a position facing the end portion of the first metal terminal.

9. The semiconductor device according to claim 7, wherein the first distance is 1.2 times or more and 2.0 times or less the second distance.

10. The semiconductor device according to claim 7, wherein a thickness of the first metal terminal is equal to a thickness of the second metal terminal.

11. The semiconductor device according to claim 7, wherein a thickness of the first metal terminal is thinned toward the end portion of the first metal terminal and a thickness of the second metal terminal is thinned toward the end portion of the second metal terminal.

12. The semiconductor device according to claim 7, wherein the resin layer is a thermoplastic resin.

* * * * *